United States Patent [19]

Matthews

[11] Patent Number: 5,107,460
[45] Date of Patent: Apr. 21, 1992

[54] SPATIAL OPTICAL MODULATOR

[75] Inventor: James A. Matthews, Milpitas, Calif.

[73] Assignee: MicroUnity Systems Engineering, Inc., Sunnyvale, Calif.

[21] Appl. No.: 535,728

[22] Filed: Jun. 11, 1990

Related U.S. Application Data

[63] Continuation-in-part of Ser. No. 466,787, Jan. 18, 1990, Pat. No. 5,089,991.

[51] Int. Cl.$^5$ .............................................. G11C 11/18
[52] U.S. Cl. ..................................... 365/122; 365/170
[58] Field of Search .......................... 365/122, 9, 170; 357/27; 350/375, 376, 378

[56] References Cited

U.S. PATENT DOCUMENTS

| | | | |
|---|---|---|---|
| 3,988,704 | 10/1976 | Rice et al. | 332/7.51 |
| 4,079,429 | 3/1978 | Travot et al. | 360/114 |
| 4,438,508 | 3/1984 | Urner-Willie et al. | 365/122 |
| 4,516,144 | 5/1985 | Jaskolski et al. | 357/27 |
| 4,650,290 | 3/1987 | van Engen et al. | 350/375 X |
| 4,727,341 | 2/1988 | Nishi et al. | 332/7.51 |
| 4,837,526 | 6/1989 | Suzuki et al. | 332/7.51 |

OTHER PUBLICATIONS

*IBM Technical Disclosure Bulletin*, vol. 3, No. 10, Mar. 1961, J. J. Coughlin et al., "Non-Destructive Readout For Thin Film Memory", p. 7.

Primary Examiner—Joseph A. Popek
Attorney, Agent, or Firm—Blakely, Sokoloff, Taylor & Zafman

[57] ABSTRACT

An optical modulator utilizing a magnetic semiconductor device, whose operation is based on the Hall effect, includes a magnetic material formed on a semiconductor substrate. When an incoming beam of light having a dominant polarization direction is directed onto the magnetic material it becomes modulated. The result is an outgoing beam of light which has a rotated plane of polarization when compared to the dominant polarization direction. The direction of the rotated plane of polarization is indicative of the information stored in the magnetic material. The modulator of the present invention further includes a means for writing the information to the magnetic material and a semiconductor sensor means for electrically verifying the contents of the magnetic material.

14 Claims, 10 Drawing Sheets

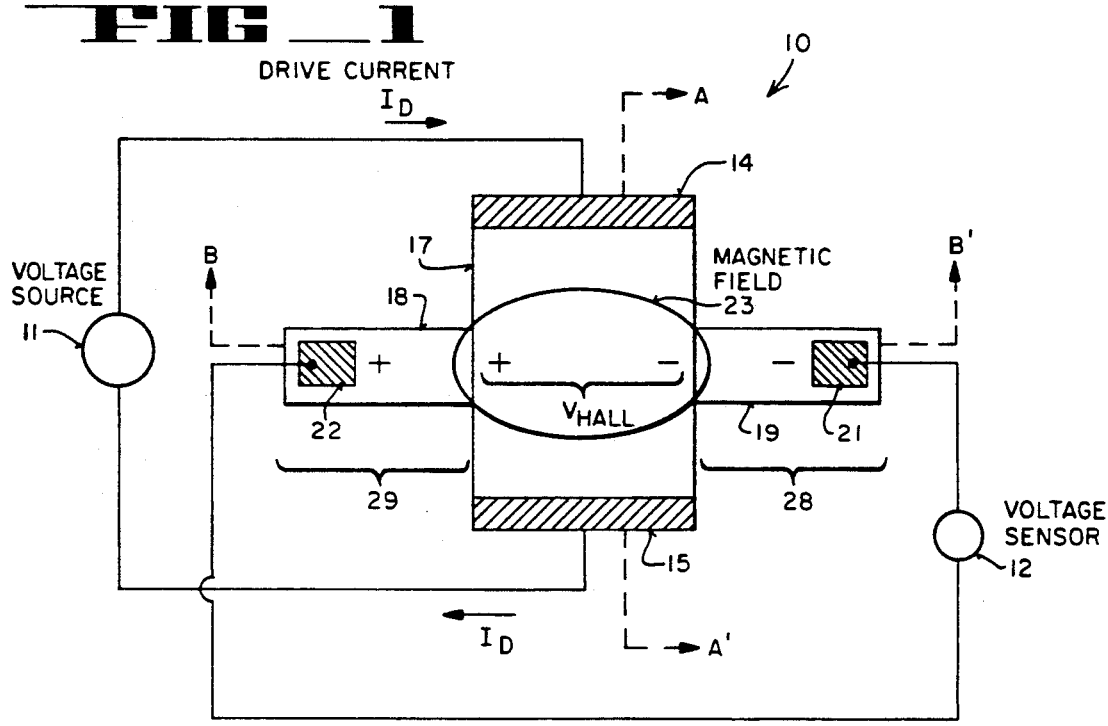
FIG_1
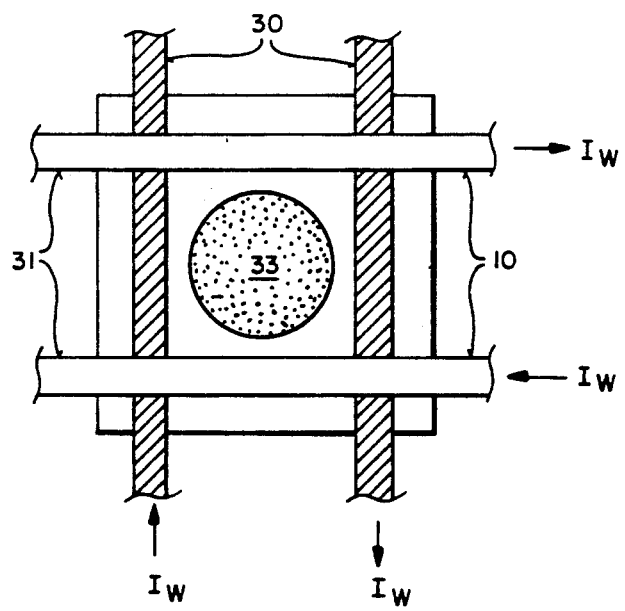
FIG_2

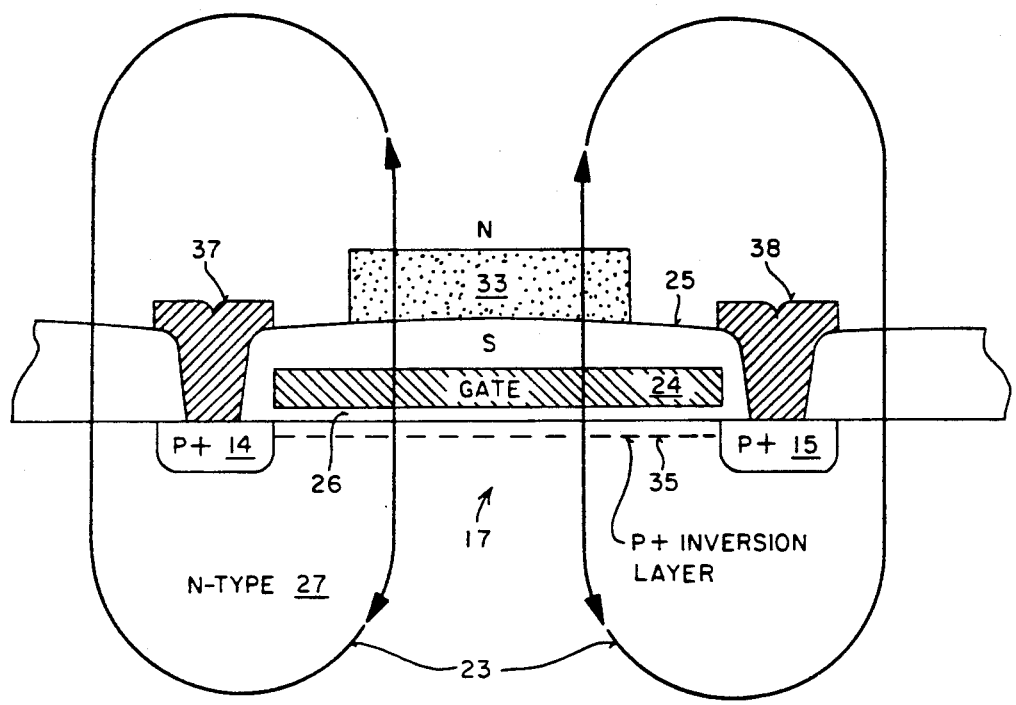
FIG_3
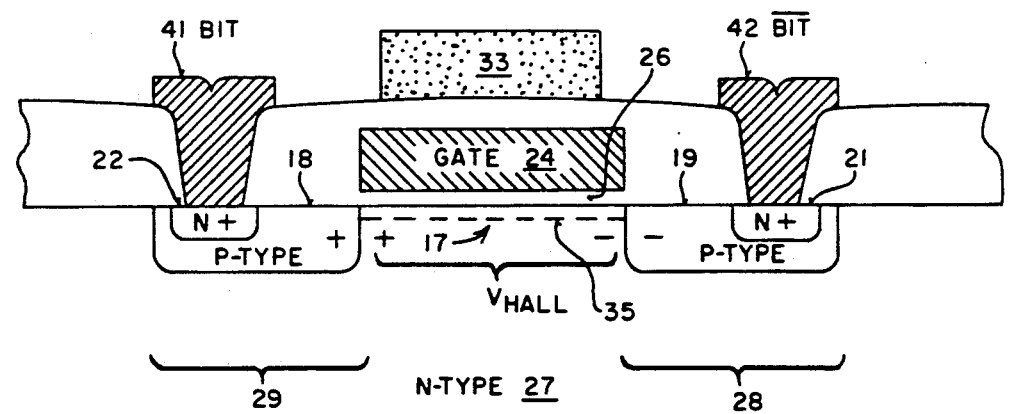
FIG_4

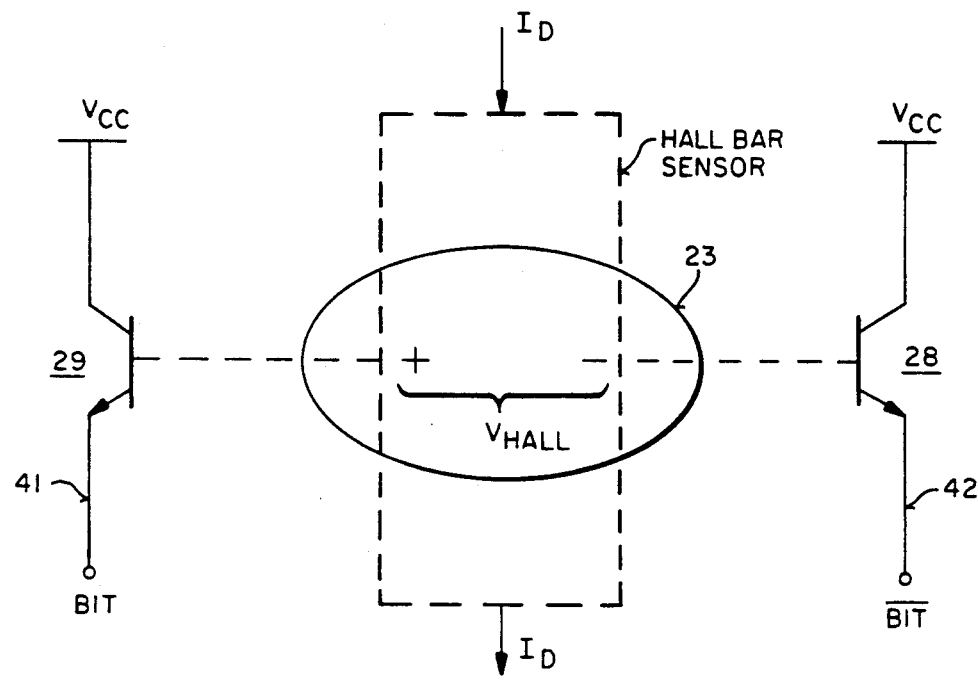
FIG_5
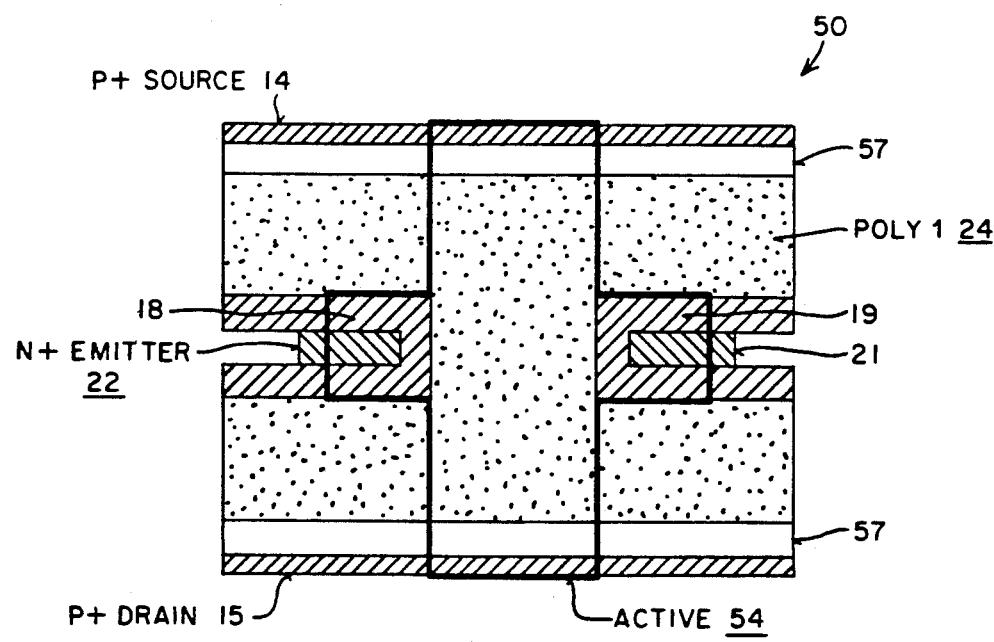
FIG_6

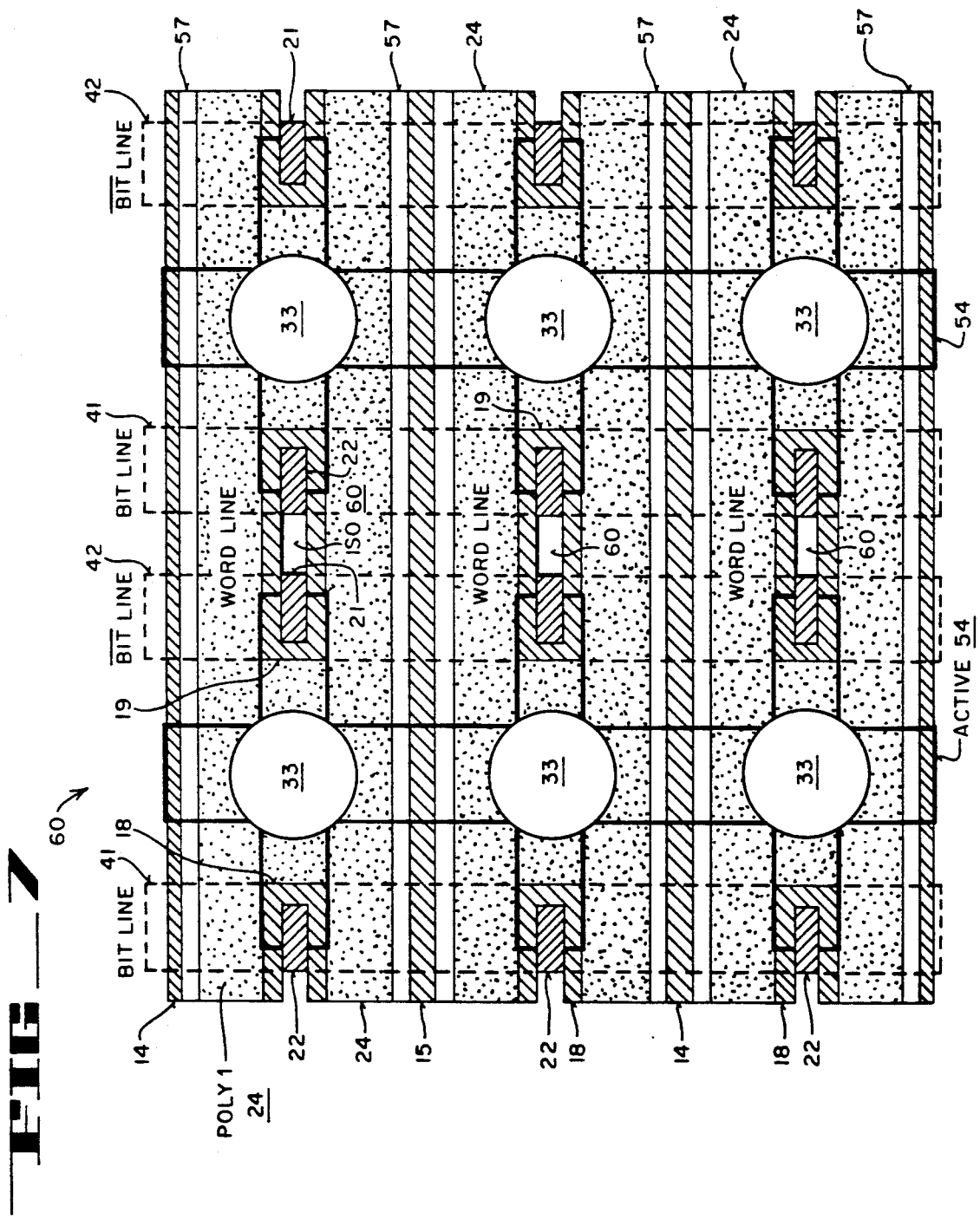
FIG_7

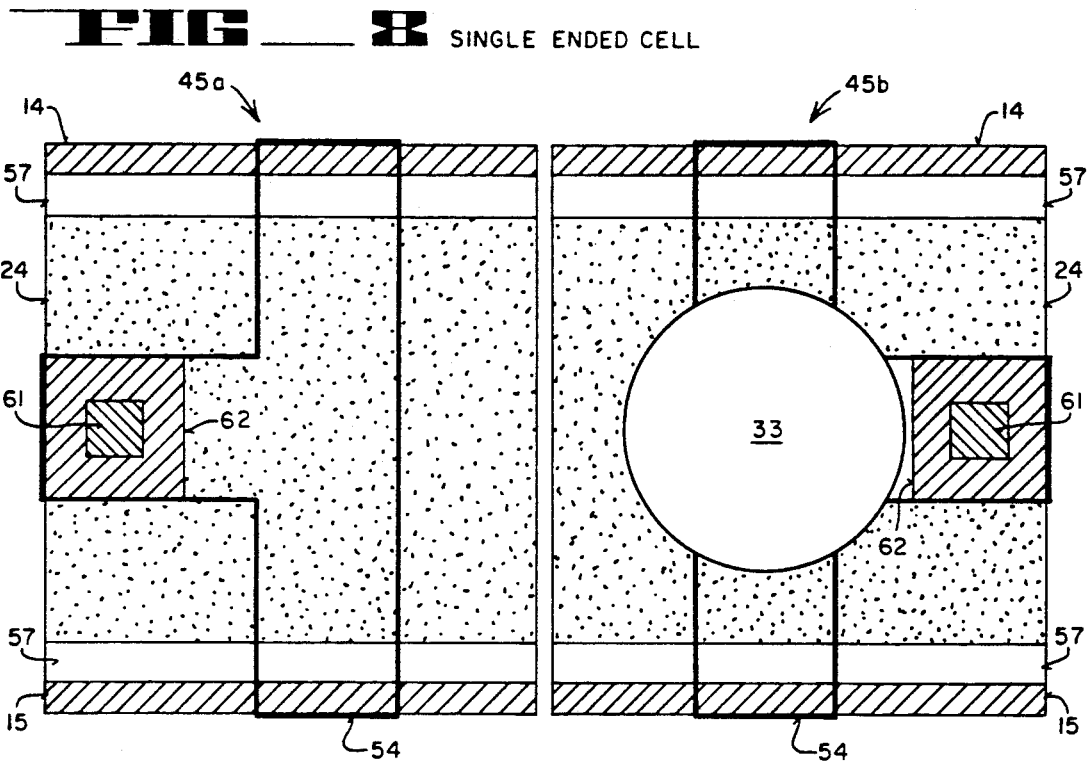
FIG_8  SINGLE ENDED CELL
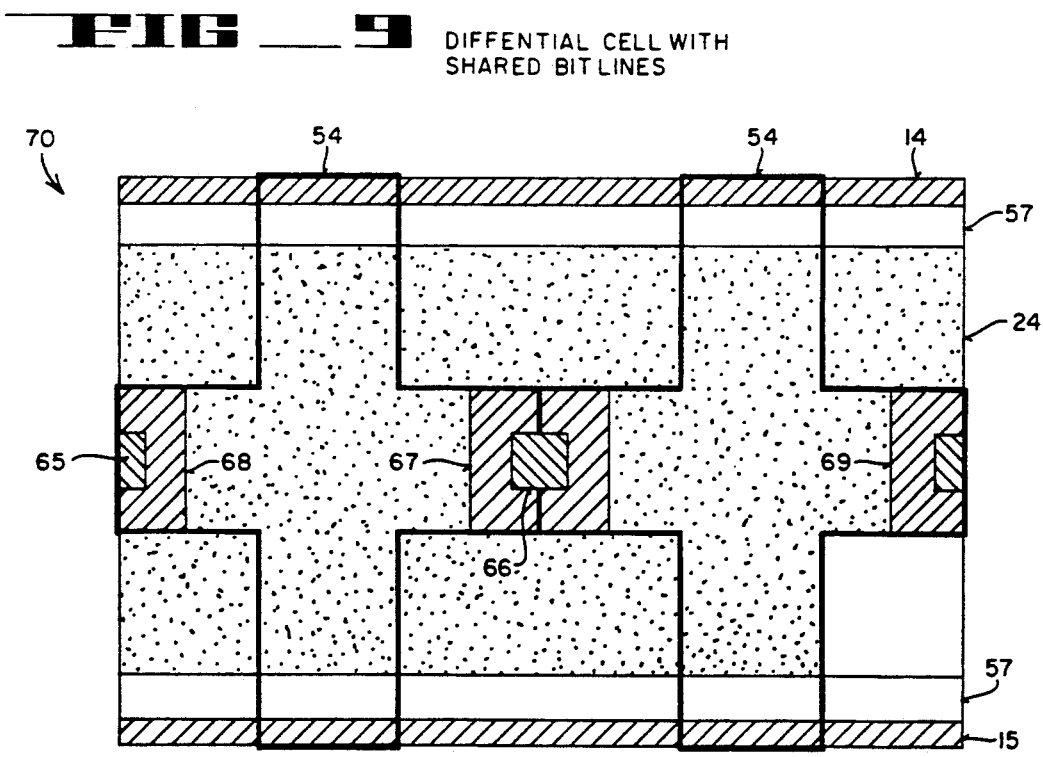
FIG_9  DIFFENTIAL CELL WITH SHARED BIT LINES

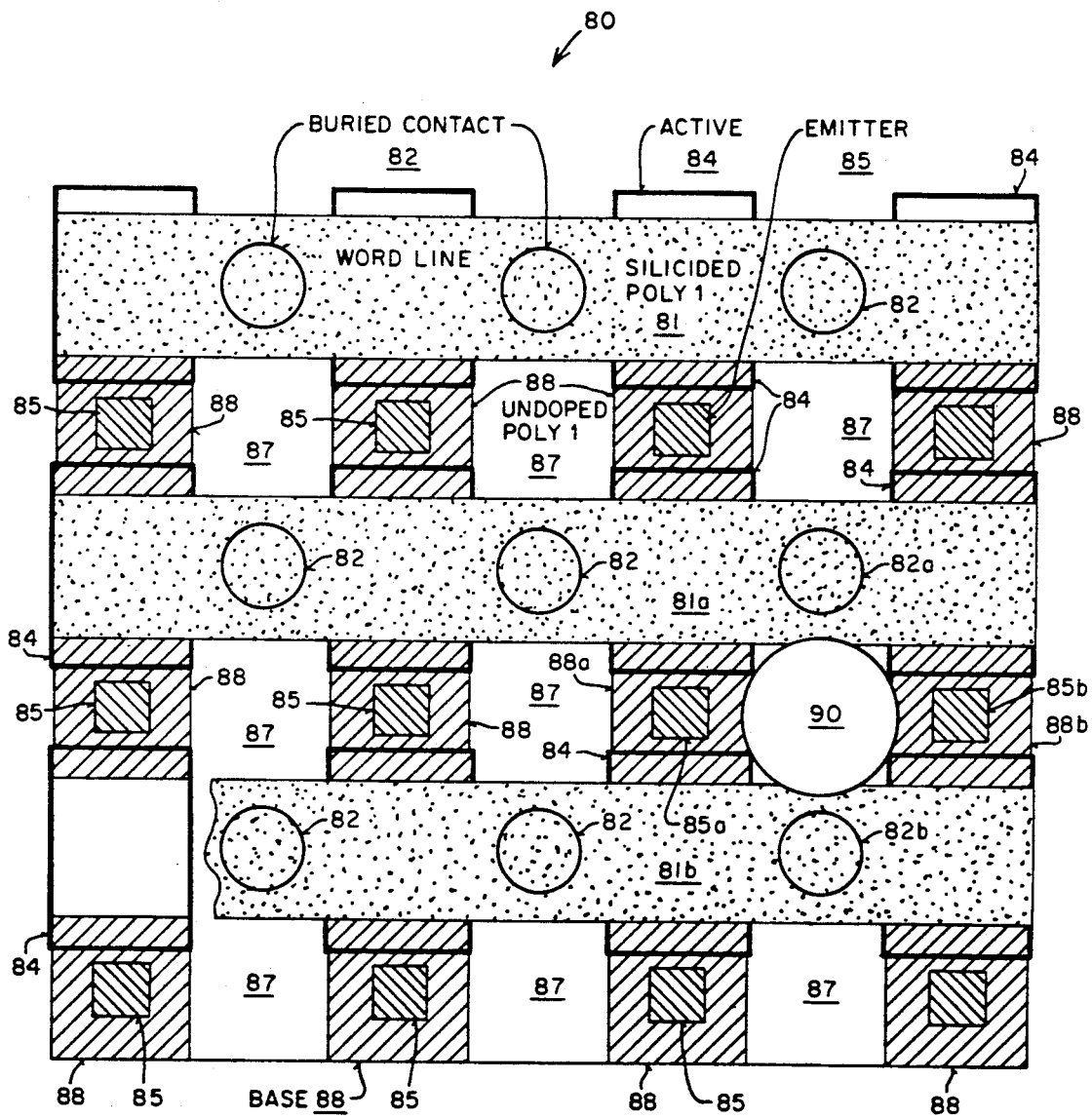
FIG_10

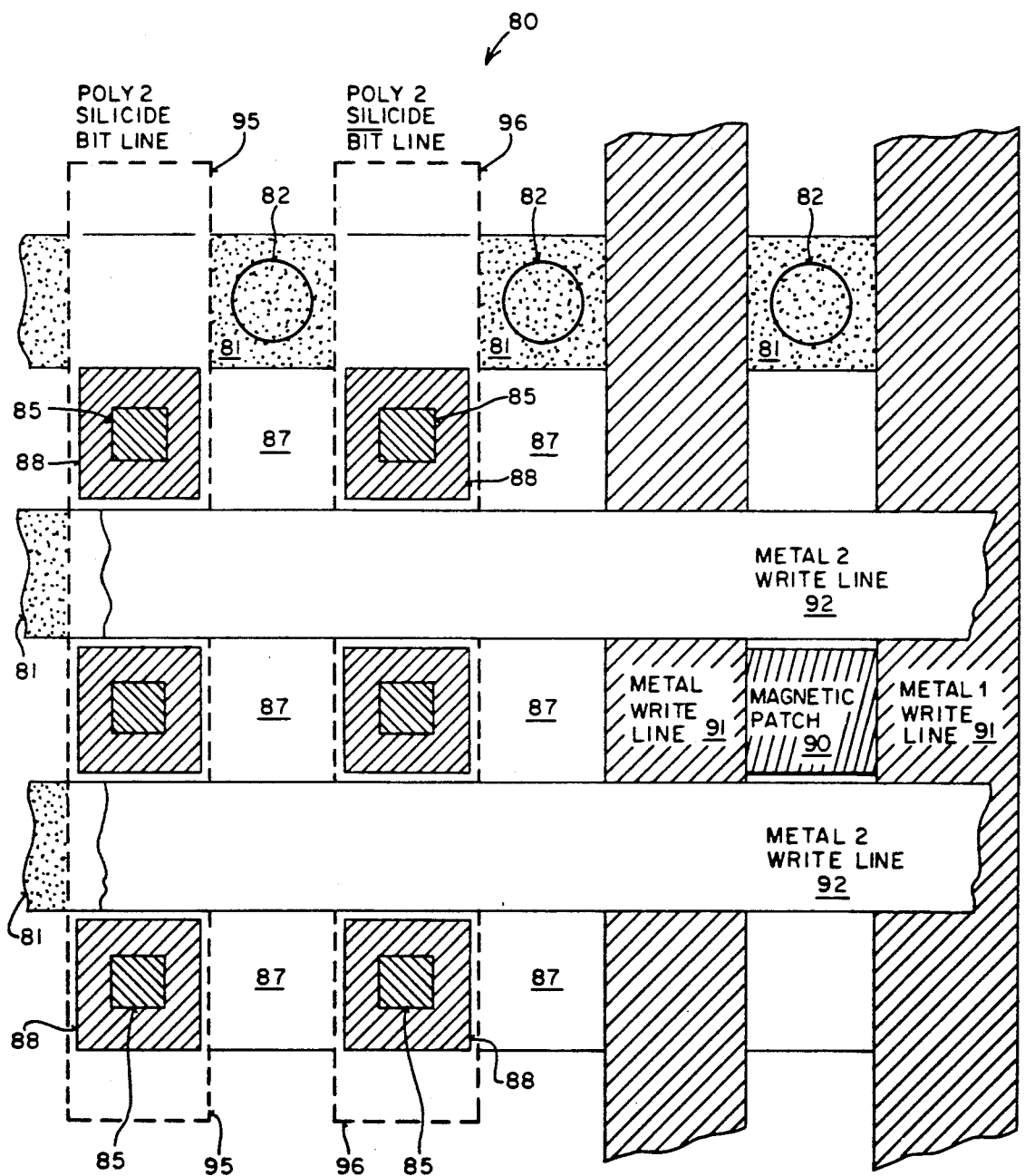

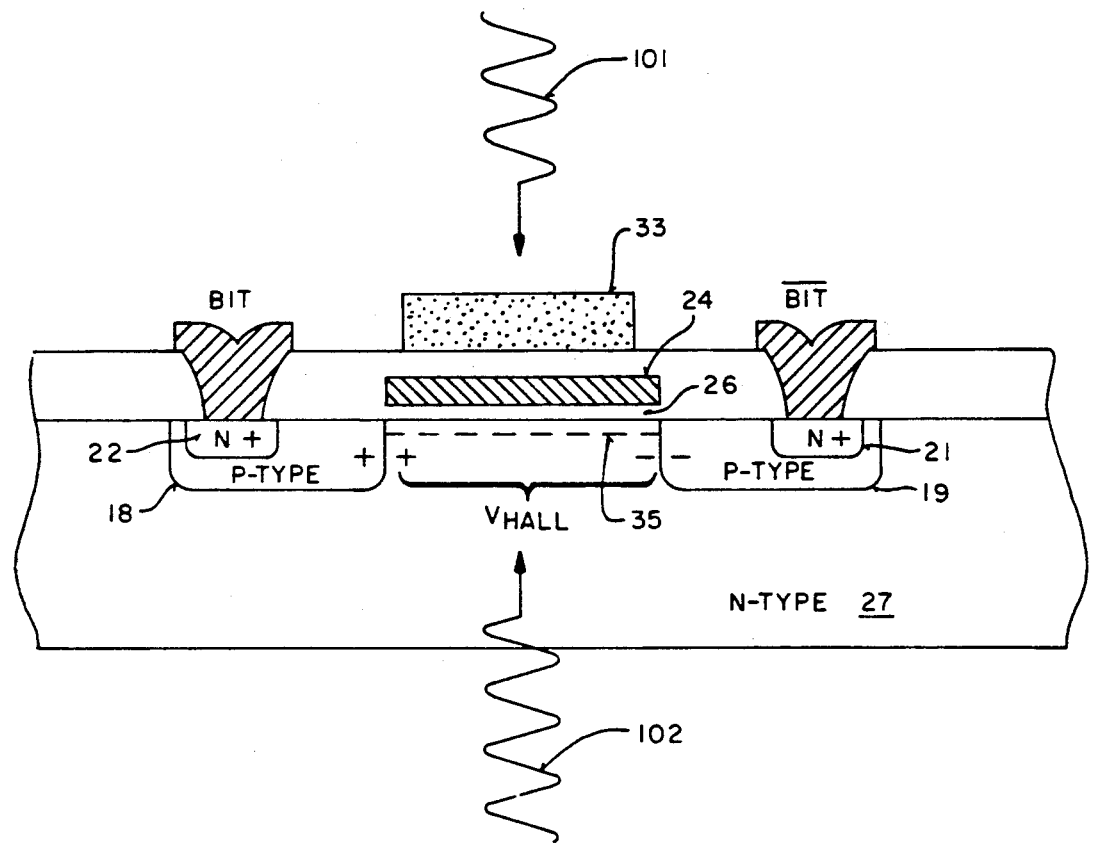
FIG_12
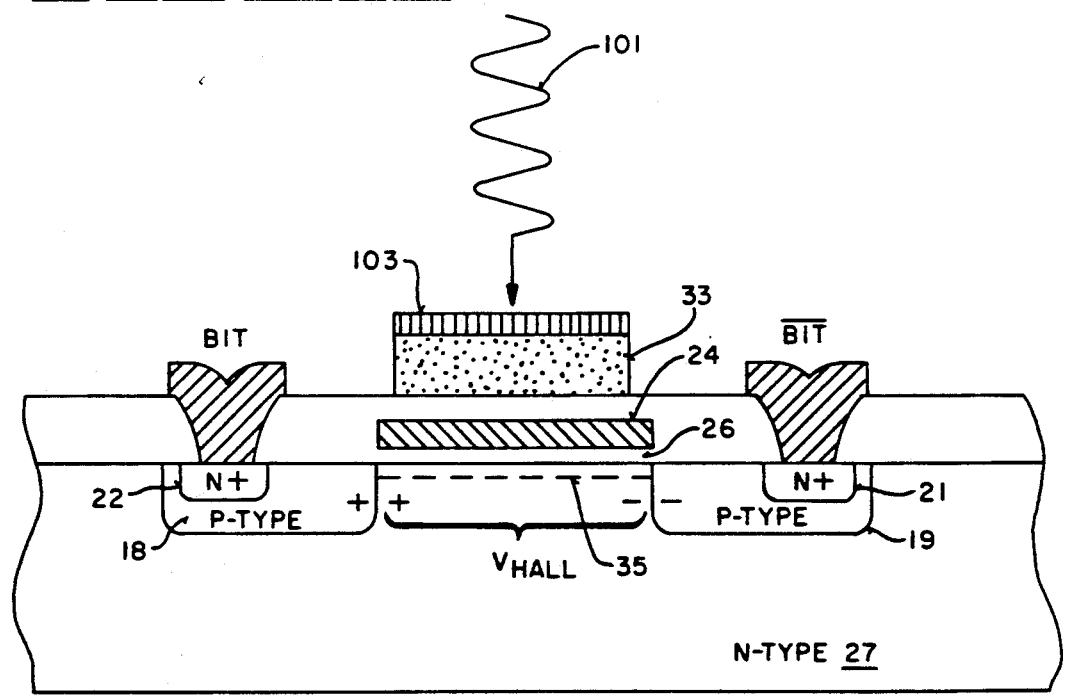
FIG_13

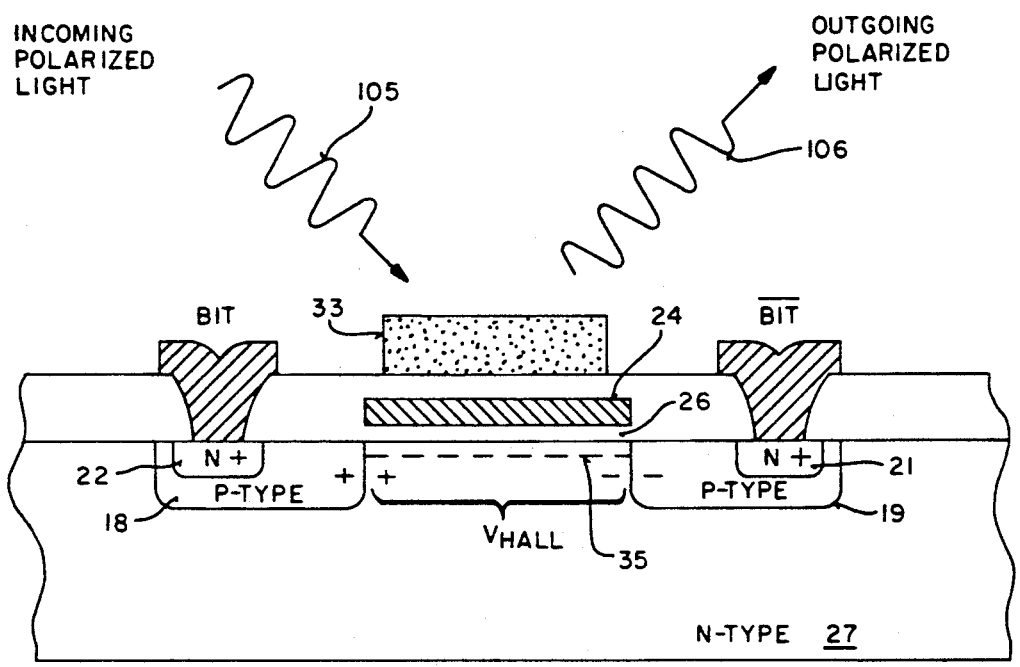
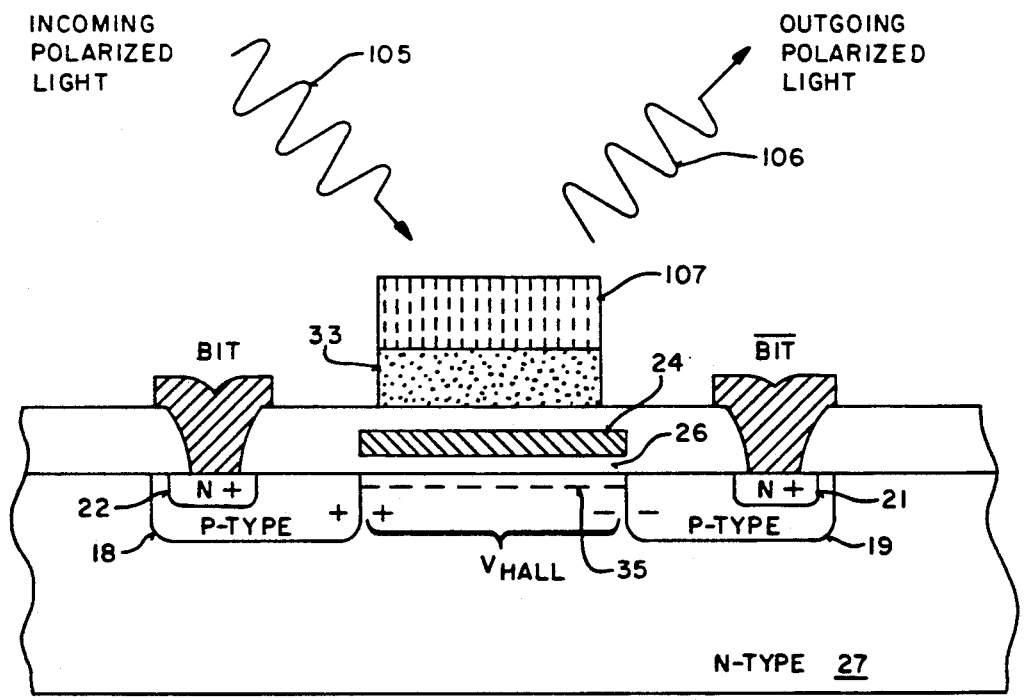

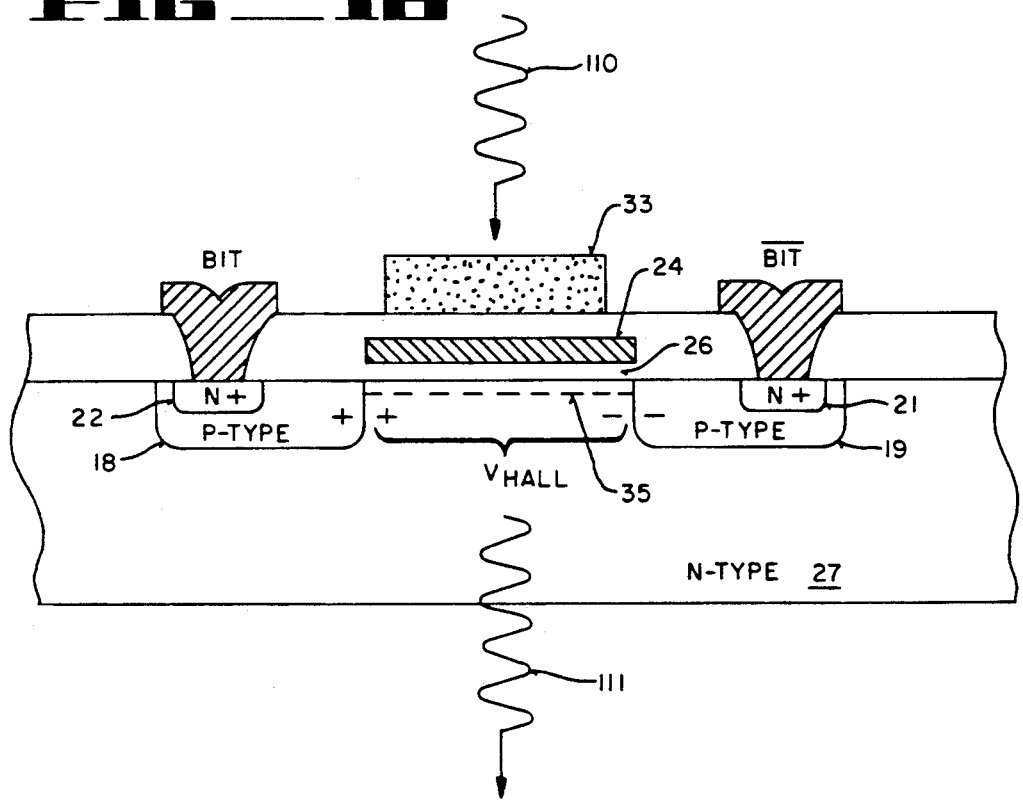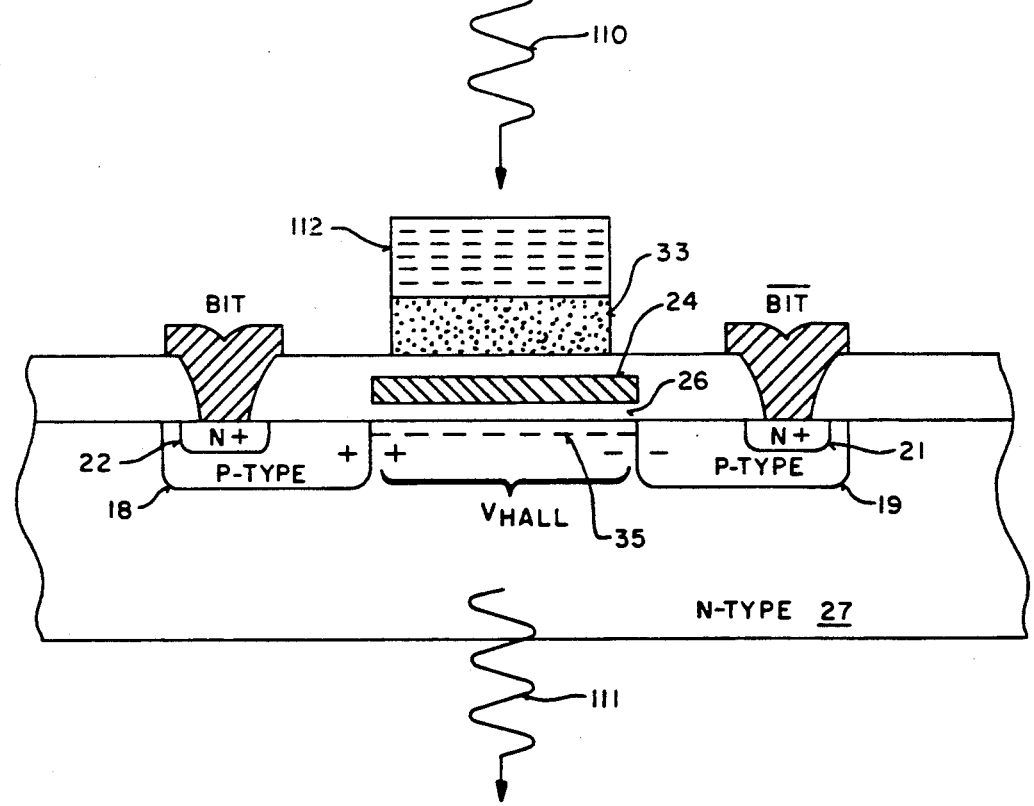

SPATIAL OPTICAL MODULATOR

RELATED APPLICATIONS

This is a continuation-in-part application of U.S. patent application entitled "Non-Volatile Memory Cell", Ser. No. 07/466,787; filed Jan. 18, 1990; which application is assigned to the assignee of the present invention.

FIELD OF THE INVENTION

This invention relates to the field of optical modulators; most particularly, those devices which employ magnetic cell arrays for varying the polarization of incoming radiation.

BACKGROUND OF THE INVENTION

When a magnetic field is applied to a conductor carrying a current, in a direction at right angles to the current, an electromotive force is produced across the conductor in a direction perpendicular to both the current and to the magnetic field. This effect, known as the Hall effect after E. H. Hall who discovered it in thin metallic foils in 1879, has become one of the most powerful tools for studying the electronic properties of semiconductors. As it is most commonly used today, the measurement of the Hall voltage enables a process engineer to determine the number of current carriers per unit volume within a semiconductor device, and also whether they are positively or negatively charged.

In the past, certain classes of semiconductor devices have utilized the Hall effect for for particularized applications. For example, U.S. Pat. No. 4,516,144 discloses a magnetically sensitive semiconductor device used to sense crankshaft angle positions in automotive system. In the operation of that device, carriers from an emitter region travel through a base region toward one or the other of a pair of spaced-apart collector regions. The carriers are deflected toward one or the other collector regions according to the polarity of a perpendicularly applied magnetic field. The strength and direction of the magnetic field is determined by the crankshaft angle position.

The presence of a magnetic field also works to change the properties of light travelling through it. A device which changes the irradiance (or direction) of the light passing through it is called a modulator. There are several general types of modulators; namely, mechanical, electro-optic, magneto-optic, elasto-optic, and passive modulators. Optical modulators are described generally in U.S. Pat. Nos. 4,079,429 and 3,988,704.

Many modulators rely on well-understood optical effects and principles such as the Kerr effect, the Faraday effect, the acousto-optic effect, etc. For example, liquid Kerr cells filled with nitrobenzene and placed between crossed polarizers have been used extensively as optical switches or modulators in place of ordinary Pockels cells. Modulation at frequencies up to $10^{10}$ Hz have been obtained.

The Faraday effect is a magneto-optic effect of real interest for optical modulators. In the Faraday effect, a beam of plane polarized light passing through a substance subjected to a magnetic field is observed to rotate by an amount proportional to the magnetic field component parallel to the direction of propagation. Important in the Faraday effect, is the fact that the rotation of the plane of polarization is independent of the direction of propagation.

For some time, researchers have attempted to apply the above described effects for the purpose of developing a large capacity computer memory. It is believed that optical effects could overcome the problems and constraints inherently associated with magnetic or conventional semiconductor memories. Such an optical memory would be capable of storing large amounts of information in a relatively small area and operate at extremely high data rates. Because of its great potential, it is particularly desirable to develop a semiconductor magnetic memory cell capable of acting as an optical modulator. However, the integration of a magnetic memory storage element and a semiconductor sensor to produce a device which is effective as an optical modulator has thus far proven to be a formidable task. Examples of optical modulators which utilize semiconductor materials are found in U.S. Pat. Nos. 4,727,341 and 4,837,526.

As will be seen, the present invention integrates a magnetic storage element with a solid-state sensor and/or amplifier to form a novel memory cell effective as a spatial light modulator. Data is stored in the form of magnetized patches or domains in a magnetic material placed in close proximity to a semiconductor sensor. In a preferred embodiment, the magnetic field is directed vertically through the semiconductor sensor to generate a transverse voltage in accordance with the Hall effect. The Faraday or Kerr effects are utilized to rotate the plane of polarization of laser light incident upon the memory cell for read out. The direction of the change in the polarization of the laser beam on passing through or being reflected from the memory elements depends on the directions of magnetization. Magnetizations of the memory elements in one direction may represent 'ones'; in the opposite direction 'zeros'. The spatial optical modulator of the present invention is such that it lends itself to numerous embodiments and a variety of applications.

SUMMARY OF THE INVENTION

An optical modulator utilizing a magnetic semiconductor device, whose operation is based on the Hall effect, is disclosed. In one embodiment, the present invention includes a magnetic material formed on a semiconductor substrate. The magnetic material stores information in the form of a magnetic field. When an incoming beam of light having a dominant polarization direction is directed onto the magnetic material it becomes modulated. The result is an outgoing beam of light which has a rotated plane of polarization when compared to the dominant polarization direction. The direction of the rotated plane of polarization is indicative of the information stored in the magnetic material.

The modulator of the present invention further includes a means for writing the information to the magnetic material and a means for electrically verifying the contents of the magnetic material.

The verification means employs a Hall-effect semiconductor sensor for reading the stored data from the magnetic patch. Each sensor comprises a Hall bar through which a current is made to flow using an external means. The current flows in a first region of semiconductor substrate in a direction transverse to the magnetic field. In this way, a Hall voltage is developed across the Hall bar in a direction transverse to the direction of both the magnetic field and the current.

The sensor for sensing the Hall voltage includes second and third substrate regions formed adjacent to, and having the same conductivity type as, the first region. Thus, when the Hall voltage is produced across the first region, the second and third regions ohmically sense this voltage to read the information.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 illustrates the basic Hall sensor used in the modulator of the present invention.

FIG. 2 illustrates the top view of the basic memory cell in which a magnetic patch is formed above a semiconductor Hall sensor. Also shown are the write lines used for magnetizing the patch.

FIG. 3 is a cross sectional view of the embodiment of FIG. 1 along lines A-A'.

FIG. 4 shows a cross sectional view of the embodiment of FIG. 1 along the lines B-B'.

FIG. 5 shows an equivalent circuit schematic of the embodiments of FIGS. 3 and 4.

FIG. 6 illustrates a top view of the optical modulating magnetic memory cell as fabricated according to the currently preferred BiCMOS process.

FIG. 7 shows a top view of an array of six magnetic memory cells. The illustration of FIG. 7 also includes the location of the magnetic patches, the bit lines and the wordlines.

FIG. 8 shows an alternative embodiment of the basic magnetic semiconductor memory device as a single-ended cell.

FIG. 9 shows an alternative embodiment of the basic magnetic semiconductor memory device as a differential cell employing shared bit lines.

FIG. 10 shows an alternative embodiment in which a minimum area magnetic semiconductor memory array is fabricated using the currently preferred BiCMOS process.

FIG. 11 shows the magnetic memory array used in currently preferred embodiment of the present invention.

FIG. 12 illustrates how Curie point writing may be employed in conjunction with the modulator of the present invention.

FIG. 13 illustrates an alternative embodiment in which Curie point writing is altered by the inclusion of a thermal absorber or reflector to the basic cell.

FIG. 14 illustrates how the Kerr magneto-optical effect may be used in conjunction with the modulator of the present invention.

FIG. 15 shows an alternative embodiment in which read out of the cell is made more efficient by the inclusion of a material which exhibits the Kerr magneto-optical effect.

FIG. 16 illustrates how the Faraday effect may be used in conjunction with the modulator of the present invention.

FIG. 17 shows an alternative embodiment in which read out of the cell is made more efficient by the inclusion of a material which exhibits the Faraday effect.

DESCRIPTION OF THE PREFERRED EMBODIMENT(S)

A magnetic semiconductor memory cell useful as a spatial optical modulator is described. In the following description numerous specific details are set forth, such as specific conductivity types, dimensions, materials, etc., in order to provide a more thorough understanding of the present invention. It will be obvious, however, to one skilled in the art that these specific details need not be used to practice the present invention. In other instances, other well-known structures and circuits have not been shown in detail in order to avoid unnecessarily obscuring the present invention.

There is shown in FIGS. 1 and 2 a magnetically-sensitive semiconductor memory device fabricated in a substrate material. The memory device includes a semiconductor sensor 10 and a magnetic patch 33 which is preferably formed directly above sensor 10. Magnetic patch 33 stores data in the form of a magnetic field. In the case of binary information, the magnetic field is oriented either up or down (e.g., either into or out of the page in FIGS. 1 and 2). When analog data is stored, multiple magnetic domains are formed in patch 33.

Detecting the polarity of the magnetic field, i.e., reading data stored in patch 33, is accomplished using sensor 10. When fabricated in an array, each memory cell comprises a sensor 10 and a magnetic patch 33, together with associated read and write lines. The operation of sensor 10 is based on the well-known Hall effect, whereby a transverse voltage, $V_{Hall}$, is developed across a conductor carrying a current in the presence of a magnetic field. The polarity of the Hall voltage is dependent on the direction of the current flow, the charge sign of the current carriers and the direction of the magnetic field. If the direction of the current flow and charge sign of the carriers is known, then the direction of the magnetic field is easily determined. Therefore, in sensing the polarity of $V_{Hall}$ the contents of the memory cell is read. Of course, the contents of patch 33 is actually the magnetic domain which represents the stored data. In the case of an analog memory, the magnitude and polarity of the Hall voltage is sensed when reading data.

In the simplest case of the Hall effect, current flow is generated through a semiconductor bar to obtain a voltage directed perpendicular to the length of the bar. Although the Hall sensor is ordinarily fabricated in a semiconductor substrate, it may comprise any material which expresses the Hall effect. Conceivably, it could comprise materials other than silicon as well. By way of example, the sensor utilized in the presently invented memory cell may comprise a vacuum in which an electron beam is partially deflected to one side or the other. For certain high speed applications, an ideal Hall sensor is realized by a two-dimensional electron gas. Such a gas is commonly found near the metallurgical junction of many III-IV type heterostructures (e.g., GaAs/AlGaAs). Therefore, it is appreciated that the described Hall sensor may alternatively comprise many different structures and/or materials without departing from the spirit or scope of the present invention.

In the particular embodiment of FIGS. 1 and 2, sensor 10 comprises a semiconductor Hall bar fabricated in a silicon substrate. The drive current, $I_d$, enters the Hall bar at p+ drain region 14 and exits the bar at p+ source region 15. The spaced-apart regions 14 and 15 define a channel 17 therebetween. The combination of regions 14, 15, channel 17 and an overlying polysilicon gate (not shown in FIG. 1) form an ordinary p-channel metal-oxide-semiconductor (MOS) device. As is well understood, the application of a low potential (e.g., 0 Volts) to the control electrode of a p-channel MOS device causes an inversion layer to be generated directly below the substrate surface in channel 17. This inversion layer provides a conductive path for the drive current $I_d$ to flow. In the particular implementation of FIG. 1, external voltage source 11 generates drive current $I_d$.

Ideally, the Hall effect is most pronounced when the semiconductor Hall bar is fairly thin. A thin current carrying region means a higher current density which, in turn, produces a higher Hall voltage, $V_{Hall}$. A larger Hall voltage is generally desired for greater output and sensitivity. In this respect, about the thinnest current sheet ($\sim$ 100-200 Å) that may be realized is an inversion layer. As the current $I_d$ flows along channel 17, the voltage $V_{Hall}$ appears in the thin inversion layer transvers to the direction of current flow. Obviously, this assumes the presence of a local magnetic field whose lines of flux are perpendicular to both $I_d$ and to $V_{Hall}$. The oval ring 23 in FIG. 1 denotes a magnetic field directed either into or out of the page. As previously mentioned, magnetic field 23 is produced by magnetic patch 33.

With continuing reference to FIG. 1, an important aspect of the present invention is the integration of a pair of bipolar transistors into the Hall sensor as buffer amplifiers. These transistors are shown in FIG. 1 as transistors 28 and 29. The base-emitter regions of NPN transistor 28 are indicated by regions 19 and 21, respectively, while the base-emitter regions for the NPN transistor 29 (located on the opposite side of channel 17) are indicated by regions 18 and 22, respectively. The n-type substrate acts as a common collector for both transistors. As will be described further, the Hall voltage generated in the inversion layer of the MOS transistor becomes ohmically coupled to base regions 18 and 19. In this way, the voltage $V_{Hall}$ produces a difference potential across emitters 21 and 22, which is then detected by voltage sensor 12.

It is appreciated that each of the semiconductor regions of Hall sensor 10 may be fabricated using conventional bipolar process technology. Most desirable, however, is a process in which bipolar and MOS type devices are fabricated on the same substrate. These processes are often referred to as BiCMOS processes. In the currently preferred embodiment of the present invention the BiCMOS process disclosed in U.S. Patent Application entitled "BiCMOS Process Utilizing Novel Planarization Technique", Ser. No. 07/463,290; filed Jan. 10, 1990, is utilized to fabricate Hall sensor 10. The above application is assigned to the assignee of the present invention and is herein incorporated into this application by reference.

Referring now to FIG. 2, the types of magnetic materials used in the topology of the present invention are preferably the same materials which are commonly used in the field of perpendicular magnetic recording. Typically, magnetic patch 33 comprises a cobalt-chromium (CoCr) alloy film which is deposited by one of several different methods. For instance, the magnetic film may be applied by sputtering, evaporation, electroplating, etc. Each of these methods are compatible with modern semiconductor technology. It may also be feasible to deposit the magnetic material by the process of spincoating or sedimentation.

In the sedimentation process, a suspension of magnetic particles in a binder system is deposited over the wafer surface. The magnetic particles are then allowed to settle into holes which have been previously etched between write lines 30 and 31. The magnetic particles are properly oriented or aligned by applying a magnetic bias to the suspension as the binder cools or cures. This process is similar to that used to manufacture magnetic tape, except in this case the particles are oriented vertically rather than horizontally. Preferably, magnetic patch 33 is grain-oriented so that the magnetic field lines are arranged vertically (i.e. either into or out of the page in FIGS. 1 and 2) relative to sensor 10. Acceptable thicknesses generally lie in the range between 0.1 to 3.0 microns thick. Research indicates that a wide variety of magnetic materials satisfy the requirements of coercivity, remnant magnetization, and magnetic hardness for the memory cell of the present invention.

Realize that magnetic patch 33 is not limited to the circular shape depicted in FIG. 2. Instead, it may be square, rectangular or, even be a small portion of a continuous layer of magnetic material deposited over the wafer surface. The only requirement is that patch 33 be electrically isolated from write lines 30 and 31 and from the active regions of semiconductor sensor 10.

Writing to the memory cell of FIG. 2 is achieved by forcing the magnetic particles in an individual patch 33 to assume a particular orientation or polarity. This is most easily accomplished by generating a localized magnetic field of sufficient strength to "flip" the polarity of patch 33 in the desired direction. In the preferred embodiment, a large write current, $I_W$, is directed along lines 30 and 31 to properly magnetize patch 33.

FIG. 2 illustrates a typical direction of $I_W$ along conductor lines 30 and 31 during a write cycle. Conductor lines 30 and 31 are normally fabricated from first and second layer metal (i.e., metal 1 and metal 2), respectively. The patterning of these lines is in accordance with well understood photolithographic techniques. The magnitude of the current $I_W$ which flows through write lines 30 and 31 is usually on the order of 10 milliamps for a patch which is approximately one square micron in dimension. The resulting magnetic field produced in patch 33 gives rise to a Hall voltage which is on the order of about one Volt.

With reference to FIG. 3, a cross sectional view of the magnetic memory cell of FIG. 1 is illustrated. The view in FIG. 3 is taken along the cut line labeled A-A'. Spaced-apart p+ regions 14 and 15 are shown fabricated in an n-type substrate 27. Regions 14 and 15 are fabricated using either ordinary diffusion or ion implantation techniques. A polysilicon gate 24 is formed directly above the channel 17. Gate 24 is insulated from substrate 27 by the gate oxide 26 below, and from magnetic patch 33 by a dielectric insulation layer 25 above. Ohmic contact to regions 14 and 15 is provided by members 37 and 38, respectively. According to the preferred BiCMOS process, members 37 and 38 comprise doped polysilicon; however, ordinary metal may also be used.

During normal read operations of the memory cell of FIG. 3 polysilicon gate number 24 is grounded to create a p+ inversion layer 35 in channel 17 of the sensor. Once inversion layer 35 has been formed, the drive current $I_d$ may flow between source/drain regions 14 and 15. The voltage, $V_{Hall}$, is produced across layer 35 (directed either into or out of the page) in response to magnetic field 23. FIG. 3 also shows patch 33 patterned on top of layer 25 and magnetically-oriented so that its south pole is nearest to gate 24. This results in a magnetic field whose lines of flux are shown by arrows 23 in FIG. 3.

In FIG. 4 a cross sectional view of the magnetic memory cell of FIG. 1 is shown along cut lines B-B'. FIG. 4 illustrates how the bipolar junction transistors are integrated with the MOS Hall sensor. Basically, this is achieved by forming base regions 19 and 18 directly adjacent to the channel region 17 so that inversion layer 35 extends to what normally is the base-collector junction of transistors 28 and 29.

In FIG. 4, p-type region 19, n+ region 21 and n-type substrate 27 form NPN transistor 28. NPN transistor 29 is formed by substrate 27, p-type base region 18 and n+ emitter region 22. As discussed above, when current $I_d$ flows across inversion layer 35, a Hall voltage is developed across the transverse portion of channel 17. The p-type inversion layer 35 extends completely across channel 17 where it makes ohmic connection to each of the p-type bases 18 and 19. Thus, the voltage $V_{Hall}$ developed in inversion layer 35 is ohmically coupled to base regions 18 and 19 of transistors 29 and 28, respectively.

It is appreciated that although the preferred embodiment utilizes a p-channel MOS device, the present invention could also be implemented using an n-channel MOS Hall sensor integrated with PNP emitter followers for sensing the $V_{Hall}$. As previously described, Hall sensor 10 could also be fabricated in a different substrate material, as a heterostructure device, or any other device or material which expresses the Hall effect.

Transistors 28 and 29 are configured as emitter followers to function as sensitive, high-impedance amplifiers. The Hall voltage, indicative of the data of information stored in patch 33, therefore appears across emitters 21 and 22 where it can be read by decoder circuitry coupled to lines 41 and 42. Lines 41 and 42 provide electrical contact to n+ emitter regions 22 and 21, respectively, and are shown labeled Bit and $\overline{Bit}$. In other words, when binary data is stored in patch 33, the voltages appearing on lines 41 and 42 have values corresponding to either a logical "1" or a logical "0".

According to the currently preferred BiCMOS process flow, lines 41 and 42 comprise second layer silicided polysilicon (poly 2) patterned into lines which contact each of the emitters within a column of an array. This poly 2 silicide is covered with a silicon nitride layer upon which the magnetic patch 33 is formed. Because, the fundamental operation of the invented memory cell is not very sensitive to the exact placement of patch 33, it could also be formed directly over the poly 2 silicide lines 41 to 42 if the magnetic patch were implemented using a non-conductive magnetic material such as chromium dioxide.

Recognize that the magnetic semiconductor memory cell thus far described is entirely static and non-volatile. This means that information stored within patch 33 is retained indefinitely regardless of how many read cycles are performed. This obviates the need to refresh the memory periodically as is the case in conventional DRAM memories. Moreover, in addition to being static and non-volatile, the described memory cell is also capable of being manufactured to extremely small cell dimensions (typically on the order of 5 square microns per cell). Depending on certain design choices and methods of fabrication, the invented memory cell has unusually fast access times. In addition, the invented memory cell is radiation hard—a feature which is particularly important in certain military applications.

To perform a read operation on a single memory cell located within an array, the following procedure is used. First, polysilicon gate member 24 is grounded to generate inversion layer 35 in the underlying channel 17. (In the case of an n-channel MOS Hall sensor, gate 24 is taken to a high positive potential such as $V_{CC}$). Most often, gate member 24 comprises a wordline coupled to a row of identical cells. Therefore, activating a wordline in the array forms an inversion layer in each of the memory cells located within that row.

As soon as the current $I_d$ begins to flow in channels 17, the voltage $V_{Hall}$ appears across each of the base regions 18 and 19. The polarity of the Hall voltage sensed across base regions 18 and 19 is, of course, dependent upon the polarity of magnetic patch 33. Hence, the data stored in patch 33 is translated to a voltage which is sensed by bipolar transistors 28 and 29. The voltages appearing on Bit lines 41 and 42 are eventually decoded by column decoders associated with the array to access the information stored relative to base region 19. Such decoder circuitry is well known in the field of semiconductor memories.

As is appreciated by practitioners in the art, transistors 28 and 29 not only provide current amplification, but also provide buffering of the Hall voltage between the memory cells connected along the shared bit lines within the array. In other words, the emitter followers function as both current amplifiers and as buffers. If the NPN transistors 28 and 29 were omitted from FIGS. 1 through 4 (e.g., if lines 41 and 42 were fabricated as buried bit lines to ohmically contact the transverse sides of channel region 17) then each cell would electrically short out the other during read operations. Accordingly, there is a need to isolate the Hall voltage produced in a single cell from all of the other cells in the memory array. Note that pass transistors may be used to buffer the Hall voltage from the other memory cells as an alternative. However, the inclusion of pass transistors would complicate the basic memory cell design and necessitate additional interconnects and control logic.

Another advantage of using bipolar transistors in an emitter follower configuration is that emitter followers typically have a very low impedance looking back into the emitter terminal. This is important because it is desired that the voltage $V_{Hall}$ have a high drive capability; that is, the emitter followers must provide a large amount of current and impedance transfer, since the bit lines themselves have a relatively large capacitance and are connected to Y-decoder circuitry.

In the normal emitter follower configuration, bit lines 41 and 42 are one base-emitter voltage drop ($V_{be}$) down from the voltage appearing on either side of the sensor. By way of example, if a positive voltage is sensed by base region 18 and a negative voltage sensed by base region 19, then line 41 would be $V_{Hall}-0.7$ Volts. The magnitude of the difference between the voltages present on lines 41 and 42 is approximately equal to the voltage $V_{Hall}$.

Sensing and decoding of the information stored in patch 33 may also be done in other ways. For instance, it is possible to leave gate 24 grounded at all times so that inversion layer 35 is continuously present. The power supply line coupled to either region 14 or 15 could then be pulsed momentarily to generate drive current $I_d$. Other variations, well within the skill of an ordinary practitioner in the art, are also possible.

Writing is performed, as discussed above, by flowing current along write lines 30 and 31 in such a way as to generate a magnetic field strong enough to force the magnetic particles in patch 33 to "flip" to the desired orientation. FIG. 2 shows a write current $I_W$ directed along lines 30 and 31 so as to cause patch 33 to be magnetized in a vertical direction, i.e., where the magnetic field 23 is directed out of the page. In the currently preferred process for fabrication of the memory cell, write lines 30 and 31 comprise metal 1 and metal 2 lines, respectively, and are formed above semiconductor sensor 10 and magnetic patch 33.

The magnetic patch itself can be anywhere between 0.1 microns, or less, to several microns in thickness and still generate a sufficiently strong magnetic field for read operations. Moreover, there is no strict requirement that patch 33 be placed in the same general plane as lines 30 and 31 since the magnetic flux lines generated by the current $I_W$ will extend far above and far below the metal 1 and metal 2 plane. Note that the write lines 30 and 31 are not connected electrically to anything other than the current drivers used to produce current $I_W$.

Referring to FIG. 5, an equivalent circuit of the basic memory cell is shown. The circuit comprises a p-channel MOS Hall bar sensor along which current $I_d$ is directed perpendicular to a magnetic field 23. This generates a Hall voltage $V_{Hall}$ across the transverse width of the Hall bar. As previously described, the voltage $V_{Hall}$ is then ohmically coupled to the bases of transistors 29 and 28. The substrate 27 acts as a common collector for each of these transistors, and, in the emitter follower configuration, is coupled to the supply potential, $V_{CC}$ (e.g. 5 volts). The emitters of transistors of 28 and 29 are coupled to Bit line 41 and $\overline{Bit}$ line 42, respectively.

When fabricated in an array consisting of rows and columns of cells, lines 41 and 42 are generally coupled to every emitter within a column of the memory array. At the bottom of the column, Bit lines 41 and $\overline{Bit}$ lines 42 are coupled to Y-decoder circuitry which decodes the stored information from the individual cells within the array. Since polysilicon gate 24 (see FIGS. 3 and 4) is normally implemented as a wordline, it forms the gate of each cell in a horizontal row across the array. To summarize, when an individual row within a memory array is selected by grounding the appropriate wordline, and current $I_d$ is applied to the particular cell to be read, then stored data appears on Bit line 41 while the complement of that data appears on and $\overline{Bit}$ line 42.

Referring to FIG. 6, a typical layout of a single memory cell 50 fabricated according to the currently preferred BiCMOS process is illustrated. The layout of memory cell 50 includes p+ source region 14 and p+ drain region 15. Both regions 14 and 15 are formed by diffusion of impurities from an overlying polysilicon layer, as described in the incorporated application. A first polysilicon layer is used as a diffusion source and as an electrical contact to regions 14 and 15. Polysilicon gate 24 comprises a wordline in the array and is shown separated from the source and drain regions 14 and 15 by spacer oxide 57. Spacer oxide 57 is used to electrically isolate polysilicon wordline 24 from the polysilicon members which contact source and drain regions 14 and 15. (The polysilicon members which contacts regions 14 and 15 are referred to as SDE polysilicon in the incorporated application).

The base regions for the integral NPN transistors are denoted as regions 18 and 19. The emitters for the respective NPN transistors are shown as regions 22 and 21. The active region for the memory cells is shown enclosed by the boundary line 54. Magnetic patch 33 is not illustrated in FIG. 6 so that the full extent of polysilicon layer 24 may be shown clearly. In the actual implementation, magnetic patch 33 resides directly above the center of active region 54 (see FIG. 7).

To sense the data stored in the magnetic patch of the memory cell 50, poly 1 wordline 24 is first grounded. Next, a drive current $I_d$ is supplied by connecting an external voltage source across source/drain regions 14 and 15. This produces a current $I_d$ which flows through the channel region of the p-channel MOS Hall sensor. The transverse magnetic field 23 generates the voltage $V_{Hall}$ which is ohmically coupled to base regions 18 and 19. With the underlying n-type substrate electrically connected to $V_{CC}$, each of the NPN transistors amplifies the sensed voltage. The stored data may then be read from lines 41 and 42, coupled to the emitters of transistors 29 and 28, respectively. Lines 41 and 42 run vertically over memory cell 50 contacting the emitter regions 22 and 21, respectively (see FIG. 7). As described above, Bit and $\overline{Bit}$ lines 41 and 42 are formed in the currently preferred process using poly 2 silicide. Protecting and insulating this poly 2 silicide layer is a layer of silicon nitride. The magnetic material which forms patch 33 is usually patterned or deposited over nitride layer.

FIG. 7 shows a simple array 60 of six memory cells—including the placement of the magnetic patches 33, poly 2 silicide lines 41 and 42, and also poly 1 wordlines 24. Understand that the polysilicon layer which forms individual wordlines 24, also covers the entire active region in FIG. 7 (except, of course, the base/emitter regions of the transistors). This includes the area directly beneath magnetic patch 33. Bit and $\overline{Bit}$ lines 41 and 42 are shown by the dashed lines running vertically over memory array 60 and contacting each emitter of an individual column.

According to the embodiment of FIG. 7, individual emitters 21 and 22 are separated by an isolation region 60. Note also that the base regions for adjacent NPN transistors associated with separate memory cells are merged into a single base region 19. Practitioners in the art will appreciate the overall density and simplicity which is realized by memory array 60. For instance, using the currently preferred method of fabrication individual cells may be formed in an area of approximately 5 square microns. The total area of the six cell array 60 is therefore about 30 square microns.

FIG. 8 is provided to show that the present invention may be practiced using a single, rather than a differential-ended, Hall voltage sensor. Memory cells 45a and 45b show two possible configurations for a single-ended memory cell. Both cells include an emitter region 61 surrounded by base region 62. The active region 54 for each device is defined by boundary line 54. The remainder of the cell functions exactly as described above in FIGS. 1-7. That is, as a current $I_d$ is driven across the channel region of the p-channel MOS sensor, a transverse Hall voltage is developed across the channel which is ohmically coupled to base region 62 of the NPN transistor. Emitter 61 is connected to a vertical bit line, which, in the case of preferred embodiment, is formed of poly 2 silicide. (Magnetic patch 33 has been omitted from cell 45a in order to show the full extent of active region 54.)

Yet another alternative memory cell arrangement is shown in FIG. 9 to illustrate how a pair of differential cells 70 may be implemented within an array using shared bit lines. In the embodiment of FIG. 9, each cell includes a pair of associated bipolar emitter followers.

The emitter and base regions of the first bipolar transistor are identified as regions 65 and 68, while the emitter and base regions of the second bipolar transistor are given as regions 66 and 67, respectively. The basic concept incorporated into the embodiment of FIG. 9 is that each emitter is shared by the adjacent memory cell. When fabricated as an array, a common poly 2 silicide line runs vertically over the pair 70 to contact emitter 66.

The main benefit realized by the embodiment of FIG. 9 is smaller cell size and consequently a denser memory array layout. Of course, the use of shared bit lines within a memory array requires that additional arithmetic be performed by the associated Y-decoder circuitry. For certain applications, however, the added complexity in the decoder circuitry may be outweighed by the advantage of reduced memory array size.

With reference now to FIG. 10, a memory array 80 is shown in which each memory cell occupies an area which is approximately 1 pitch × 1 pitch in total dimension (a pitch being the area occupied by a given minimum feature, e.g., metal plus the minimum spacing for that feature). In the currently preferred method of fabrication, one metal pitch is about one micron in width. Obviously, array 80 could easily be scaled to smaller dimensions with more advanced photolithographic techniques. Presently, it is contemplated that a 64 megabit non-volatile, static, random-access-memory (RAM) can be manufactured in an total area of less than one square centimeter. Thus, the embodiment of FIG. 10 represents an overall memory array density which has thus far been unachievable using conventional methods and practices.

In memory array 80, the emitters 85 and base regions 88 are fabricated using normal bipolar processing techniques as described above in connection with FIGS. 1-9. Also noted that a shared bit line scheme is employed so that emitters 85 are shared by adjacent cells. Active regions for the devices are defined by the boundary lines 84. In FIG. 10, the active regions are present everywhere except within the bounded rectangles formed by lines 84.

During the fabrication process of array 80, an opening is etched through a portion of the gate oxide directly below word lines 81. This opening extends completely down to the substrate surface thereby allowing electrical contact to the underlying silicon. Such contacts are commonly referred to as buried contacts and are shown in FIG. 10 by circles 82. After buried contacts 82 have been formed in the gate oxide, a layer of first polysilicon (poly 1) is deposited over the entire array. The poly 1 layer is patterned to completely cover the array except for base regions 88 and emitter regions 85. The poly 1 layer is moderately doped and makes ohmic contact through buried contacts 82 down to the underlying substrate.

Following the patterning of the first polysilicon layer, selective portions of it are silicided to form low resistance current paths. Silicided poly 1 regions are shown in FIG. 10 as region 81. As is clearly seen, silicided poly 1 lines 81 are arranged along separate rows of memory array 80. The remaining portions of the poly 1 layer (those areas which have not been selectively silicided) are identified in FIG. 10 by region 87. Region 87 functions as the gate electrode for the MOS Hall sensor and is typically left undoped. Following patterning of the first polysilicon layer, a layer of silicon nitride is deposited over the array. The deposition and patterning of the magnetic media to form individual patches 90 follows.

Although only one patch 90 is shown in FIG. 10 for reasons of clarity, it is appreciated that patches 90 reside directly above undoped poly 1 region 87 for each individual cell. Also note that the bit lines used to access information stored in patch 90, as well as the write lines for writing data into patch 90, have not been shown in FIG. 10 also for clarity reasons.

In the preferred layout of FIG. 10, there are no spaced-apart p+ regions formed within the substrate which function as source/drain regions for the MOS sensor. This obviates the use of SDE polysilicon for making electrical contact to the source/drain regions. The only place that SDE polysilicon is used in the layout of FIG. 10 is for contacting emitters 85.

The manner in which the individual memory cells of array 80 are sensed, is as follows. First, one of the silicided poly 1 wordlines 81a (adjacent to the memory cell to be read) is raised to a high positive potential. The other adjacent silicided wordline 81b (i.e. on the opposite side of the cell to be read) is grounded. To prevent disturbance from other memory cells within the array, all of the wordlines 81 below the accessed cell are grounded while all of the wordlines 81 above the accessed cell are raised to the same high positive potential, e.g. 5 volts. In other words, the portion of the array above patch 90 (to be read) has its wordlines raised to a high potential while the portion of the array below the selected path 90 has its wordlines grounded. This method of accessing a single cell within a memory array without disturbing the contents of adjacent cells is frequently referred to as "debiasing".

Due to the voltage gradient established between adjacent wordlines 81a and 81b, the buried contacts 82a and 82b effectively act as the drain and source terminals of the MOS Hall bar sensor. The voltage applied to line 81a is adjusted so as to be large enough to create an inversion layer in the channel region directly under undoped poly region 87. In certain processes this may require a small depletion implant to be introduced into the channel region, i.e. the sensor area, so as to ensure the formation of an inversion layer which extends completely across the channel. Thus, for each of the memory cells of FIG. 10, the gate, source contact and drain contact are all shared elements.

The Hall potential generated across the channel region is sensed by base regions 88a & 88b, coupled to emitters 85a & 85b, respectively. Emitters 85a and 85b are then coupled by their associated bit lines to appropriate Y-decoder circuitry.

Referring now to FIG. 11, the currently preferred embodiment of memory array 80 is shown further including write lines 92 and 91 along with poly 2 silicided bit lines 95 and 96. As is apparent, poly 2 silicided lines 95 and 96 are fabricated above, and make contact with, each of the emitters 85 within a column of the array. Directly above, and insulated from bit lines 95 and 96, are metal 1 write lines 91. Running perpendicular to, and insulated above, lines 91 are metal 2 write lines 92. Lines 91 and 92 run horizontally across memory array 80. Note that in the embodiment of FIG. 11 magnetic patch 90 is shown patterned into the shape of a square. Also note that metal 2 write lines 92 are conveniently defined directly above poly 1 silicided lines 81.

Although up to this point the discussions and explanations of the present invention have primarily assumed storage of digital information (i.e., a binary 0 or a binary 1), it should be understood that the present invention is also capable of storing multiple data bits. When employed as an analog memory cell, certain domains of magnetic patch 90 are magnetized in one direction while others are magnetized in the opposite direction. As long as magnetic patch 90 is arranged such that multiple domains are present, then multiple bits may be stored and read from patch 90. In such a situation, an analog voltage would be used to write information into patch 90 and both the magnitude and polarity of the Hall voltage would be sensed to read data form the memory cell.

MAGNETO-OPTICAL EFFECTS

Every magnetic material becomes non-magnetic when heated to a temperature high enough for thermo agitation to destroy the ordering of its molecules. The temperature at which this occurs is known as the Curie point temperature. The Curie temperature varies drastically depending upon the type of magnetic material. By way of example, most tape oxides typically have a Curie point of approximately 600 degrees C.; permalloy core heads have a Curie temperature of approximately 400 degrees C.; manganese bismuth alloy has a Curie point of approximately 300 degrees C.; and chromium dioxide ($CrO_2$) has a Curie point temperature equal to 126 degrees C.

As described above, a patch is ordinarily magnetized by subjecting it to a strong magnetic field—developed by a set of surrounding write lines each carrying a robust current $I_W$. An alternative method of writing data involves heating the magnetic material above its Curie point temperature, then cooling it through its Curie point, at which time even a weak field will magnetize it strongly. In this situation, the magnitude of the current $I_W$ needed to magnetize the magnetic patches is substantially reduced as compared to normal room temperature writing.

Under special circumstances, this type of Curie point recording can be of advantage. For instance, Curie point heating is the principle employed in modern optical disk technology. Once the magnetic material is raised to its Curie point, it does not require much energy to flip the field of orientation of the magnetic material. By way of example, the magnetic patches in the memory array could be heated by placing a polysilicon resistor near each patch and then flowing sufficient current through the resistor to heat the magnetic material above its Curie temperature.

One application in which Curie point recording might be particularly useful is where an energy source—with sufficient energy to heat the magnetic material to its Curie point—is focused on the memory array 80 of FIG. 11. When used in this manner, memory array 80 operates as a type of receiver. It receives information in the form of electrical or optical energy, wherein bits of information are stored based on whether the incident radiation is great enough to heat a particular cell above its Curie point. A useful application for such an array would be as an input device to an optical computer. For example, a 1K×1K array 80 could be initially biased to a +1 magnetic orientation with a −1 magnetic field then applied to the array using external means. An intense flash of energy representing the input information (e.g. provided by a focused electron beam or a laser) is then directed onto the array. In the case of a focused light source, the relatively bright regions would heat the magnetic patches above the Curie point, thereby flipping the orientation of the magnetic material from a +1 to a −1. In the relatively dark regions where the received energy is insufficient to raise the temperature of the patch above its Curie point, the previously encoded magnetic field would persist (e.g., +1). Thus, memory array 80 can function as a display input device which locks an optical image into a non-volatile static memory using Curie point recording. For such an application, the present invention adds an entirely new dimension to semiconductors memories; that is, magnetic recording as well as Curie point recording, wherein data may be written and stored using optical means.

FIG. 12 illustrates how incoming right radiation can be used to raise the temperature of the magnetic patch 33 of the basic memory cell. By way of example, a laser beam may be used to heat the patch 33 above its Curie point. The patch is then allowed to cool down in the presence of a magnetic field (generated either internally or externally) to write, i.e., magnetize, the patch. The state of patch 33 is then sensed by the Hall sensor as previously described. Note that the incoming radiation, e.g., laser light, can be directed onto patch 33 from either the top or the bottom surface of the substrate, as depicted in FIG. 12 by radiation arrows 101 and 102, respectively. Of course, if the incoming radiation is to be directed from the bottom of the substrate, the semiconductor sensor must be sufficiently transparent to the frequency of the radiation.

Additionally, a selective absorber layer formed in thermal contact with patch 33 can be utilized to make patch 33 more sensitive to a particular form of radiation. For instance, incorporating a black material substance into patch 33 would increase its sensitivity for ordinary optical radiation. Conversely, the use of a material that is transparent or reflective to a particular type of radiation can also be used to reduce the sensitivity to that radiation. As an example, the use of multi-layer optical interference reflectors may allow the patch to be written by a laser of one frequency (i.e., color) and not by another. This would allow selective writing, reading, etc. based on the frequency of the radiation. A semiconductor Hall effect sensor which includes an absorber or reflector material 103 placed in thermal contact with patch 33 is shown in FIG. 13.

The sensitivity of the write mechanism can be further improved by thermally isolating the patch as much as possible from the Hall sensor. This can be accomplished by thinning the Hall sensor device substrate 27 or by isolating patch 33 on top of a poor thermal conductor or a thin pedestal structure. Furthermore, preheating of patch 33 to a temperature near its Curie point obviates the need for high energy radiation needed to raise the temperature of the patch above its Curie point.

Another application of the present invention takes advantage of the Kerr magneto-optical effect. In the Kerr effect, light reflected off the surface of a magnetic material is optically polarized. The polarization angle of the electromagnetic radiation reflected from the surface of the magnetic material is a function of its magnetization. This polarization is the result of the interaction between the photons and the molecular order imposed by the magnetizing field. The stronger the magnetic field, the greater the molecular ordering and the more that the ordering influences the incident radiation. When the incident ray is already polarized and its plane and the magnetization vector both lie in the same plane, the reflected ray is also polarized. But now its main axis is rotated slightly. In all circumstances, the amount of rotation is a function of wavelength and the angle of incidence.

Taking advantage of the Kerr effect, a novel type of display device may be realized using the memory array 80 of FIG. 11. If memory array 80 is arranged such that all of the magnetic particles are visible from the top surface of the device, and an intense beam of light is reflected off of this surface, contrast will be developed between the stored bits (e.g. 1 or 0, corresponding to either light or dark patterns). When employed in this way, the memory array 80 functions as a spatial light modulator with memory. Of course, the memory array is non-volatile so that once the array has been written, the display memory is the actual image recorded. According to the currently preferred embodiment of the present invention, a 4K×4K display would be capable of producing a cinema quality (i.e. state of the art) display. Of course, gray scale information may be implemented with analog magnetic memory cells, whereas color information would require three separate planes of memory devices, or adjacent color triads as in a color CRT.

The basic magnetic memory cell previously described is shown in FIG. 14 operating as an optical modulator in accordance with the magneto-optical Kerr effect. In FIG. 14, the incoming polarized light, denoted by arrow 105, is directed onto magnet patch 33 at a certain predetermined angle. The outgoing or reflected polarized light, denoted by arrow 106, has a different plane of polarization than the incoming light; the polarization being rotated via the Kerr effect. The direction of change in the polarization of the incoming polarized light after being reflected from patch 33 depends on the direction of magnetization stored within that patch. Therefore, depending on the reflective polarization, one can decide if a given cell is storing a '1' or '0'.

FIG. 15 shows an alternative embodiment of the optical modulator of FIG. 14. The optical modulator of FIG. 15 includes a material 107, preferably comprising manganese bismuth, placed in close magnetic proximity to magnetic patch 33 (manganese bismuth is a good choice of material for both Faraday and Kerr modulators). Material 107 exhibits the magneto-optical Kerr effect so that it will experience the magnetic field generated by patch 33. In this manner, the device of FIG. 15 is used to produce a more efficient modulator since material 107 can be independently chosen to maximize the Kerr effect without concern as to its own ability to function as a memory element. In other words, material 107 acts to amplify the Kerr effect which is generated from the direction of magnetization of patch 33.

The same type of memory display device described in the foregoing discussion may also be implemented using the Faraday effect. In the Faraday effect, the incident light must pass through the magnetic material as opposed to being reflected off of it. Therefore, the memory device must be transparent to the wavelength of the light. This, however, poses no difficulty since transparency is a common characteristic of many magnetic garnets. By way of example, silicon is transparent to infrared light while gallium phosphide (GaP) is transparent to ordinary white light. Silicon-on-sapphire also has desirable transparency properties.

Once light is passed through the magnetic material (according to the Faraday effect) or is reflected off of the surface of the magnetic material (according to the Kerr effect) it is simply analyzed with a polarizer to determine the value of the individual bits of data within the array.

Referring to FIG. 16, incoming polarized light 110 is shown passing through magnetic patch 33, as well as the semiconductor Hall sensor formed in substrate 27, in accordance with the Faraday effect. Note that both the magnetic patch and the semiconductor substrate are chosen to be transparent to the radiation 110. By the Faraday effect, the outgoing light 111 has its plane of polarization rotated due to the direction of the magnetic field stored within patch 33. Depending on the magnetic state of patch 33 (i.e., a "1" or "0") outgoing light beam 111 will have a different polarization. This polarization modulation is easily converted to intensity modulation by passing the outgoing light through a polarizing filter.

It is appreciated that the modulator of FIG. 16 is unique in that the state of every pixel (element) can be read out or verified by reading the state of the magnetic patch using the Hall sensor described earlier. This feature permits the modulator to be written and then electrically verified before the optical source is committed.

FIG. 17 illustrates an alternative embodiment of the cell of FIG. 16 which incorporates a material 112 (e.g., manganese bismuth) which exhibits a large Faraday effect. Material 112 is formed in close magnetic contact with memory patch 33. This allows the memory function to be decoupled from the modulator function, thereby allowing a more efficient modulator to be realized.

ADDITIONAL APPLICATIONS

The basic semiconductor Hall sensor described above also functions well as a magnetic disk or tape read transducer, wherein the sensor is used to detect flux density changes emanating from the surface of a magnetic storage medium. Compared to standard inductive and magnetoresistive read heads currently in use, the invented semiconductor sensor is smaller and has a much better sensitivity. A transducer incorporating the basic Hall device of FIG. 4 could be used in both vertical and longitudinal recording.

Interestingly, a linear array comprising several hundred of these sensors may be utilized to form a sort of extra-wide read head element which extends radially across the surface of the magnetic medium (e.g., disk). By incorporating the appropriate electronics such a head would be capable of reading (in a random manner) several hundred tracks simultaneously to greatly increase disk read bandwidth. For example, instead of getting a serial bit data stream, one obtains an entire "long word", e.g., 256 bits, in the same time it takes to read one bit using conventional techniques. Expanding on this idea, a two-dimensional array of Hall sensors (e.g., comprising 1024×1024 cells) may be used as a gigantic read head which allows random read access to any of 1 Meg data elements positioned under the head at any given time.

As the Hall sensor is not required to move to sense the magnetic state of the bits, a novel and useful combination semiconductor SRAM and "disk" is constructed by depositing a stationary magnetic film on an appropriate substrate material, i.e., glass. The "head" comprises a large array of standard Hall sensor memory cell, such as the array of FIG. 10, but without any magnetic material (e.g., patches 90 in FIG. 10) in the sensors. (Optionally, various "soft" magnetic materials may be added to the sensors for the purpose of focusing and intensifying the reading and writing magnetic fields.)

In use, the array is attached to an accurate X-Y positioner which places the array anywhere over the magnetic substrate. Once the array is positioned and placed in close proximity to the magnetic material the array functions analogous to a standard SRAM, except that in this case the magnetic material is external the the array. In this way, SRAM access is achieved to any of the bits positioned under the head element (i.e., the sensor array) while at the same time "disk-like" access is available to a much larger amount of data.

This idea could, of course, be extended in many ways. For instance, employing a large array of the sensor arrays would allow more of the data storage media to be directly under a "head" for SRAM access. Thus, performance would be improved albiet at the added expense of a larger array.

An alternative embodiment employs a media that does not move. This embodiment would be ideal for so-called "smart cards" which store medical, credit, or other information and data. In this situation, the card is inserted into a read/write terminal which contains a stationary Hall sensor array. The array is positioned against a magnetic patch on the card. The magnetic patch stores information in an array like manner such that the sensor array is able to read and write information in a simple SRAM-like mode. A simple "cards" and sensor arrays may be used for electronic keys in a security system. The advantage of this system over conventional "smart cards" is that the cards and the readers themselves are extremely inexpensive to manufacture and allow easy access to a plethora of data. Additionally, digitized high resolutioned photographs and voice samples are easily included on such a "card". Security in such a system is extremely high as a reader device is easily made such that no write circuitry is included in the array, thus making it impossible to convert a stolen reader device into a writer.

Recognize that these advanced "smart cards" may be configured in any convenient shape. Such cards may be an ideal replacement for floppy disks, particularly for portable computers, where the size, weight and power consumption of a floppy drive is undesirable. Another familiar use may be found in data storage in electronic cameras, as an alternative to small floppy disks. Here the SRAM access mode allows the direct display of a picture on a monitor without the need for additional semiconductor RAM which is normally needed to implement a frame buffer. This realizes a significant cost savings. Such a system also facilitates editing in the camera if two read/write sensor arrays are made available. That is, while simultaneous reading and writing to a secondary storage location could be performed. All manner of signal processing, such as contrast enhancement, color correction, edge sharpening, etc., could then be performed directly in the camera without the need for external processing.

Whereas many alterations and modifications of the present invention will no doubt become apparent to a person of ordinary skill of the art after having read the foregoing description, it is to be understood that the particular embodiments shown and described by way of illustration are in no way intended to be considered limiting. For example, although this disclosure has shown a particular way of fabricating an optical modulator, other implementations are possible. Therefore, reference to the details to the preferred embodiment are not intended to limit the scope of the claims which themselves recite only those features regarded as essential to the invention.

Thus, a spatial optical modulator utilizing a magnetic semiconductor memory cell has been described.

I claim:

1. An optical modulator comprising:
   a magnetic material formed on a semiconductor substrate for storing information in the form of a magnetic field, said magnetic material modulating an incoming beam of light having a dominant polarization direction to produce an outgoing beam of light having a rotated plane of polarization when compared to said dominant polarization direction, the direction of said rotated plane of polarization being indicative of said information stored in said magnetic material;
   means for writing said information to said magnetic material; and
   means for electrically verifying said information stored within said magnetic material, said verifying means including a means for generating current flow in a first region of said substrate in a direction transverse to said magnetic field, said current flow producing a Hall voltage across said first region, and a sensor means coupled to said first region for sensing said Hall voltage, said sensor means including second and third substrate regions formed adjacent to said first region such that when said Hall voltage is produced across said first region, said Hall voltage also appears across said second and third regions.

2. The modulator of claim 1 wherein said first region comprises an inversion layer produced by a metal-oxide-semiconductor device.

3. The modulator of claim 2 wherein said second and third regions comprise the bases of a pair of bipolar transistors, said bases being of the same conductivity type as said inversion layer.

4. The modulator of claim 3 further comprising a circuit means for decoding of said Hall voltage, said circuit means being coupled to the emitters of said bipolar transistors.

5. The modulator of claim 1 wherein said writing means comprises:
   means for heating said magnetic material above its characteristic Curie point temperature; and
   means for exposing said magnetic material to optical radiation of an energy sufficient to alter the magnetic orientation of said magnetic material, thereby writing said information, when said magnetic material is heated above its Curie point, but said energy being insufficient to change said orientation whenever said magnetic material is at a temperature below its Curie point.

6. The modulator of claim 1 wherein said outgoing beam of light is a reflection of said incoming beam of light according to the magneto-optical Kerr effect.

7. The modulator of claim 6 further comprising another material formed in close magnetic proximity to said magnetic material said another material exhibiting the Kerr magneto-optical effect such that writing of said information is made more efficient.

8. The modulator of claim 1 wherein said substrate and said magnetic material are transparent to said incoming and outgoing beams of light and wherein said modulator operates according to the Faraday effect.

9. The modulator of claim 8 further comprising an additional material formed in close magnetic proximity to said magnetic material, said additional material exhibiting the Faraday effect such that writing of said information is made move efficient.

10. An optical storage device comprising:
   a plurality of memory cells formed in a semiconductor substrate and arranged in rows and columns so as to form an array, each cell including:
   a magnetic material formed on said semiconductor substrate for storing information in the form of a magnetic field, said magnetic material modulating an incoming beam of light having a dominant polarization direction to produce an outgoing beam of light having a rotated plane of polarization when compared to said dominant polarization direction, the direction of said rotated plane of polarization being indicative of said information stored in said magnetic material;
   said device further comprising
   means for writing said information to said cells by focusing an image on said array, said image having a contrast which includes relatively bright and relatively dark portions, said writing means being operable such that said bright portions of said image provide sufficient energy to heat certain ones of said cells to a temperature above the Curie point of said magnetic material while said dark portions of said image provide insufficient energy to heat the remaining ones of said cells above said Curie point, said writing means further comprising a magnetic source for changing the magnetic orientation of said certain ones of said cells whenever the temperature of said cells is raised above said Curie point;
   a means for electrically verifying said information stored within said magnetic material;
   a means for reading said information from said cells by focusing a beam of light having a dominant polarization direction onto said magnetic material of each of said cells to produce an outgoing beam of light having a rotated plane of polarization when compared to said dominant polarization direction, the direction of said rotated plane of polarization being indicative of said information stored in said magnetic material.

11. The storage device of claim 10 wherein each of said cells further comprises:
   first and second regions of a conductivity type different from than that of said substrate, said first and second regions forming a channel therebetween;
   a gate member for generating an inversion layer in said channel thereby permitting a current to flow between said first and said second regions, said current flow being directed generally perpendicular to said magnetic field;
   a pair of bipolar transistors each of which is formed in said substrate along opposite sides of said channel such that the base region of each of said transistors is coupled to said inversion layer to sense the Hall voltage generated in said inversion layer in a direction perpendicular to both said magnetic field and said current flow, said Hall voltage being representative of said information.

12. The device of claim 11 further comprising:
   a plurality of row lines, the gate members of all cells in each row being coupled to a row line;
   a plurality of column lines each of which is coupled to one of the emitters of all cells within a column;
   a row decoding means for selecting a row line to access said information stored in a particular memory cell within said array; and
   column decoding means for decoding said Hall voltage appearing on the column line coupled to the emitter of said particular cell.

13. The device of claim 12 wherein said bipolar transistors comprise NPN transistors.

14. The memory device of claim 13 wherein said bipolar transistors comprise PNP transistors.

* * * * *